(12) United States Patent
Riegler et al.

(10) Patent No.: US 11,545,561 B2
(45) Date of Patent: Jan. 3, 2023

(54) METHODS FOR MANUFACTURING A MOSFET

(71) Applicant: Infineon Technologies Austria AG, Villach (AT)

(72) Inventors: Andreas Riegler, Lichtpold (AT); Wolfgang Jantscher, Villach (AT); Manfred Pippan, Noetsch (AT); Maik Stegemann, Pesterwitz (DE)

(73) Assignee: Infineon Technologies Austria AG, Villach (AT)

( * ) Notice: Subject to any disclaimer, the term of this patent is extended or adjusted under 35 U.S.C. 154(b) by 186 days.

(21) Appl. No.: 17/134,627

(22) Filed: Dec. 28, 2020

(65) Prior Publication Data
US 2021/0151584 A1  May 20, 2021

Related U.S. Application Data

(62) Division of application No. 16/126,850, filed on Sep. 10, 2018, now Pat. No. 10,903,341.

(30) Foreign Application Priority Data

Sep. 11, 2017  (DE) .......................... 102017120943.3

(51) Int. Cl.
*H01L 29/00* (2006.01)
*H01L 29/66* (2006.01)
(Continued)

(52) U.S. Cl.
CPC .. *H01L 29/66727* (2013.01); *H01L 21/02063* (2013.01); *H01L 21/2652* (2013.01); *H01L 21/28035* (2013.01); *H01L 21/324* (2013.01);
*H01L 21/76805* (2013.01); *H01L 21/76814* (2013.01); *H01L 21/76846* (2013.01); *H01L 21/76895* (2013.01); *H01L 29/0634* (2013.01); *H01L 29/167* (2013.01); *H01L 29/401* (2013.01); *H01L 29/408* (2013.01); *H01L 29/417* (2013.01); *H01L 29/41741* (2013.01);
(Continued)

(58) Field of Classification Search
CPC ......... H01L 29/66727; H01L 21/02063; H01L 21/2652; H01L 21/28035; H01L 21/324
See application file for complete search history.

(56) References Cited

U.S. PATENT DOCUMENTS 9,508,596 B2  11/2016  Tipirneni et al.
2005/0121720 A1  6/2005  Sin et al.
(Continued)

*Primary Examiner* — Mounir S Amer
*Assistant Examiner* — Alexander Belousov
(74) *Attorney, Agent, or Firm* — Murphy, Bilak & Homiller, PLLC

(57) ABSTRACT

A MOSFET includes a semiconductor body having a first side, a drift region, a body region forming a first pn-junction with the drift region, a source region forming a second pn-junction with the body region, in a vertical cross-section, a dielectric structure on the first side and having an upper side; a first gate electrode, a second gate electrode, a contact trench between the first and second gate electrodes, extending through the dielectric structure to the source region, in a horizontal direction a width of the contact trench has, in a first plane, a first value, and, in a second plane, a second value which is at most about 2.5 times the first value, and a first contact structure arranged on the dielectric structure having a through contact portion arranged in the contact trench, and in Ohmic contact with the source region.

9 Claims, 8 Drawing Sheets

(51) Int. Cl.
    *H01L 29/40*     (2006.01)
    *H01L 29/06*     (2006.01)
    *H01L 29/739*     (2006.01)
    *H01L 29/417*     (2006.01)
    *H01L 29/167*     (2006.01)
    *H01L 21/02*     (2006.01)
    *H01L 21/265*     (2006.01)
    *H01L 21/28*     (2006.01)
    *H01L 21/324*     (2006.01)
    *H01L 21/768*     (2006.01)
    *H01L 29/45*     (2006.01)
    *H01L 29/49*     (2006.01)
    *H01L 29/78*     (2006.01)
    *H01L 29/16*     (2006.01)
    *H01L 29/10*     (2006.01)
    *H01L 29/20*     (2006.01)

(52) U.S. Cl.
    CPC ........ *H01L 29/456* (2013.01); *H01L 29/4983* (2013.01); *H01L 29/66719* (2013.01); *H01L 29/7395* (2013.01); *H01L 29/7802* (2013.01); *H01L 29/1095* (2013.01); *H01L 29/1608* (2013.01); *H01L 29/2003* (2013.01)

(56) References Cited

U.S. PATENT DOCUMENTS

| | | |
|---|---|---|
| 2010/0035366 A1 | 2/2010 | Doehnel et al. |
| 2012/0319188 A1 | 12/2012 | Coppens et al. |
| 2013/0153988 A1 | 6/2013 | Loechelt et al. |
| 2013/0153992 A1 | 6/2013 | Loechelt |
| 2014/0183622 A1 | 7/2014 | Lin et al. |
| 2014/0217500 A1 | 8/2014 | Finney et al. |
| 2014/0374818 A1 | 12/2014 | Jin |
| 2015/0311151 A1 | 10/2015 | Chi et al. |
| 2016/0359029 A1 | 12/2016 | Zeng et al. |
| 2017/0084734 A1 | 3/2017 | Tegen et al. |
| 2018/0182629 A1 | 6/2018 | Jantscher et al. |
| 2018/0342593 A1 | 11/2018 | Enea |
| 2019/0081158 A1 | 3/2019 | Riegler et al. |
| 2019/0189509 A1 | 6/2019 | Bertrams et al. |

METHODS FOR MANUFACTURING A MOSFET

RELATED APPLICATIONS

The instant application is a divisional of and claims priority to U.S. application Ser. No. 16/126,850, the content of which is incorporated by reference herein in its entirety.

TECHNICAL FIELD

Embodiments of the present invention relate to semiconductor MOSFETs, in particular to vertical power MOSFETs and manufacturing methods therefor.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, a low on-state resistance Ron and high breakdown voltages $U_{bd}$ are often desired.

To achieve low on-state resistance Ron and high breakdown voltages $U_{bd}$, charge-compensation semiconductor devices were developed. The compensation principle is based on a mutual compensation of charges in n- and p-doped regions, which are often also referred to as n- and p-doped pillar regions, in the drift zone of a vertical MOSFET.

Not least for reasons of cost there are ongoing developments of reducing dimension(s) in semiconductor devices. However, with shrinking values of e.g. lateral width and pitch, respectively, of MOSFET-cells, the requirements for the production of reliably devices tend to grow. For example, forming contacts between a source metallization of the MOSFET and source and body regions of the MOSFET-cells may pose challenges.

Accordingly, there is a need to improve MOSFETs and the manufacturing of MOSFETs.

SUMMARY

According to an embodiment of a method for forming a MOSFET, the method includes providing a wafer including a semiconductor body including a first side, a first semiconductor region adjacent to the first side, a second semiconductor region adjacent to the first side and forming a first pn-junction with the first semiconductor region, and a third semiconductor region adjacent to the first side and forming a second pn-junction with the second semiconductor region, a first dielectric layer arranged on the first side, a gate electrode embedded in the first dielectric layer, and a second dielectric layer arranged on the first dielectric layer. Next to the gate electrode a trench is formed through the first dielectric layer and the second dielectric layer. At a side wall of the trench a dielectric spacer is formed. The trench is extended into the semiconductor body to form a contact trench.

According to an embodiment of a method for forming a MOSFET, the method includes providing a wafer including a semiconductor body including a first side, a first semiconductor region adjacent to the first side, a second semiconductor region adjacent to the first side and forming a first pn-junction with the first semiconductor region, and a third semiconductor region adjacent to the first side and forming a second pn-junction with the second semiconductor region, a dielectric structure arranged on the first side and extending to an upper side, a gate electrode embedded in the dielectric structure, a contact trench extending through dielectric structure into the third semiconductor region, and including a bottom wall and a sidewall which is arranged at the dielectric structure, and a layered dielectric structure covering the bottom wall and the sidewall and having a first layer thickness at the sidewall and a second layer thickness at the bottom wall lower than the first layer thickness. Ions are implanted through the layered dielectric structure at the bottom wall of the contact trench into the semiconductor body. At least an upper layer of the layered dielectric structure is removed to expose the bottom wall. This includes isotropic etching.

According to an embodiment of a MOSFET, the MOSFET includes a semiconductor body including a first side, a drift region adjacent to the first side, a body region adjacent to the first side and forming a first pn-junction with the drift region, and a source region adjacent to the first side and forming a second pn-junction with the body region. In a vertical cross-section perpendicular to the first side, the MOSFET further includes a dielectric structure arranged on the first side, and having an upper side, a first gate electrode embedded in the dielectric structure, a second gate electrode embedded in the dielectric structure, and a contact trench arranged between the first gate electrode and the second gate electrode, extending through the dielectric structure and at least to the source region. In a horizontal direction, a width of the contact trench has in a first plane defined by the first side a first value, and in a second plane defined by the upper side a second value which is at most about 2.5 times the first value. A first contact structure is arranged on the dielectric structure. The first contact structure includes a through contact portion which is arranged in the contact trench and in Ohmic contact with the source region.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
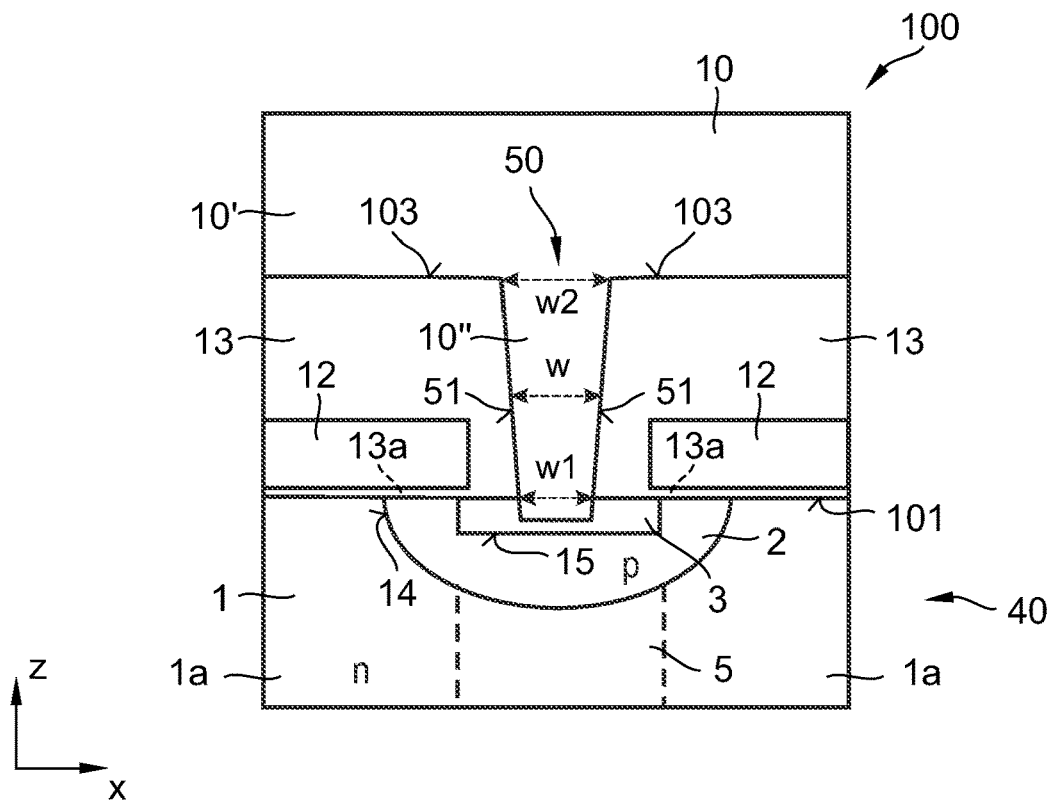
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal side of a semiconductor substrate or body, typically a respective substantially flat surface. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to field-effect semiconductor devices, in to particular to MOSFETs and manufacturing methods therefor. Within this specification the terms "semiconductor device" and "semiconductor component" are used synonymously. The field-effect semiconductor device is typically a vertical semiconductor device such as a vertical MOSFET with a drain metallization arranged on the second surface, and a source metallization and an insulated gate electrode arranged on a first surface arranged opposite to the first surface. Typically, the MOSFET is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above. The field-effect semiconductor device may, however, also be an IGBT, in particular a vertical power IGBT.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or about 500 V or about 1000V or about 3000V. Within this specification the terms "power semiconductor device" and "power semiconductor component" are used synonymously.

The term "edge-termination structure" as used in this specification intends to describe a structure that is configured to provide in a blocking mode a transition region in which a high electric voltage, i.e. a voltage of high absolute value compared to ground, such as a drain voltage around an active area of the semiconductor device changes gradually to the potential at or close to the edge of the device and/or to a reference potential such as ground, source- or gate potential. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are typically in low Ohmic connection with a drain electrode (drain metallization). The source region is typically in low Ohmic connection with a source electrode (source metallization).

In the context of the present specification, the term "in Ohmic connection" intends to describe that there is an Ohmic current path, e.g. a low-Ohmic current path, between respective elements or portions of a semiconductor device when no voltages or only small probe voltages are applied to and/or across the semiconductor device. Within this specification the terms "in Ohmic connection", "in resistive electric connection", "electrically coupled", and "in resistive electric connection" are used synonymously. In the context of the present specification, the term "in Ohmic contact" intends to describe that two elements or portions of a semiconductor device are in direct mechanical ((intimate physical)) contact and in Ohmic connection.

The terms "electrical connection" and "electrically connected" describes an Ohmic connection between two features.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrically conductive materials like e. g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

The term "pn-junction" as used in this specification intends to describe the boundary surface between (directly) adjoining semiconductor regions or semiconductor portions of different conductivity type.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN). For power semiconductor applications currently mainly Si, SiC, GaAs and GaN materials are used. If the semiconductor body comprises a high band gap material, i.e. a semiconductor material having a band-gap above 1 eV, such as SiC or GaN which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1, a first embodiment of semiconductor device 100 is explained. FIG. 1 illustrates a vertical cross-section through a semiconductor body 40 of the semiconductor device 100 which is typically implemented as a MOSFET. The semiconductor body 100 extends between a first side, typically a flat first surface 101, facing a vertical direction z, and a second side, typically a flat second surface (back surface, not shown in FIG. 1) arranged opposite to the first side (first surface) 101.

In a horizontal direction x that is substantially parallel to the first surface 101, the semiconductor body 40 is delimited by an edge or kerf, for example a sawing edge, which is typically at least substantially orthogonal to the first side or surface 101. In the following, the edge is also referred to as lateral edge. However, the edge is not shown FIG. 1 typically illustrating a portion of an active area of the semiconductor device 100 and the semiconductor body 40, respectively.

The dielectric structure 13 may, except for contact openings, substantially or even completely cover the first side 101.

Typically, the active area of the semiconductor device 100 includes a plurality of MOSFET-cells each having one gate electrode 12. The section shown in FIG. 1 may correspond to adjacent portions of two MOSFET-cells.

Typically, each of the MOSFET-cells includes a gate electrode 12 embedded in a dielectric structure 13 formed on the first side 101, typically at the first side 101.

In the exemplary embodiment, each gate electrode 12 is arranged on a respective gate dielectric portion 13a of the dielectric structure 13. The gate dielectric portions 13a are arranged between the respective gate electrode 12 and the first side 101.

In embodiments referring to n-channel MOSFETs, the semiconductor body typically includes an n-type drift region 1, a p-type body region 2 forming a first pn-junction 14 with the drift region 1, and a source region 3 forming a second pn-junction 15 with the body region 2. In embodiments referring to p-channel MOSFETs, the doping relations are reversed.

In the illustrated embodiment of a Vertical Diffused MOSFET (VDMOS), the planar gate electrode(s) 12 typically overlap with the first pn-junction 14 and the second pn-junction 15 when seen from above and in planar view, respectively.

Further, the drift region 1, the body region 2 and/or the source region 3 may adjoin (extend to) the first side 101 (in the active area).

As illustrated in FIG. 1, a contact trench 50 is typically arranged between the two gate electrodes 12 which are in the following also referred to as first gate electrode 12 and the second gate electrode 12, respectively. The contact trench 50 extends through the dielectric structure 13 and to the source region 3, more typically into the source region 3.

According to an embodiment, a width w in horizontal direction x of the contact trench 50 has, in a first plane defined by the first side 101 and/or the second side (back side of the semiconductor body), a first value w1, and, in a second plane defined by an upper side 103 of the dielectric structure 13, a second value w2 which is at most about 2.5 times the first value w1. In the following, the ratio w2/w1 is also referred to as taper ratio of the contact trench 50 in the dielectric structure 13 and broadening ratio of the contact trench 50 in the dielectric structure 13, respectively.

Further, a contiguous, electrically conductive first contact structure 10, e.g. a metallic contact structure 10 is typically arranged on the dielectric structure 13. The first contact structure 10 may include a through contact portion 10" arranged in the contact trench 50, and in Ohmic contact with the source region 3, and a covering portion 10' arranged above the contact trench 50. In the following, the through contact portion 10" is also referred to as through contact.

The covering portion 10' may form a source terminal of the MOSFET 100. Further, the covering portion 10' may at least substantially cover the active area of the MOSFET 100.

Further, a second contact structure (not shown in FIG. 1), typically forming a gate terminal and a gate pad, respectively, in Ohmic connection with the gate electrodes, may be arranged on the dielectric structure 13. In the following, the first and second contact structures are also referred to as source contact structure 10 and gate contact structure, respectively.

The source contact structure 10 may comprise a metal. Likewise, the gate contact structure may comprise a metal. The source terminal 10' and the gate terminal may even be patterned parts of a same electrically conductive material or layers of conductive materials. The gate terminal and the source terminal 10' may be separate parts, e.g. due to lithographic patterning, of a common metal wiring layer or stacked layer.

As explained in further detail below with respect to FIG. 6, using a taper ratio w2/w1 of the contact trench 50 of 2.5 or less, typically in a range from about 0.8 to 2.5, more typically in a range from about 1 to 1.8 at least substantially reduces the risk of forming seam lines 18 or cracks 18 in first contact structure 10 during manufacturing or in subsequent stress tests, such as HTGS (high temperature gate stress) and UHAST (unbiased high acceleration stress test). Accordingly, the MOSFET 100 is more reliably sealed against mobile ions from outside. Note that mobile ions diffusing from outside into the semiconductor body 40 and/or the dielectrics 13 may deteriorate the functioning of the MOSFET, e.g. the threshold voltage of the MOSFET.

Typically, the MOSFET 100 has a plurality of contact trenches 50 each having a taper ratio of at most 2.5 in the dielectric structure 13. More typically, none of the contact trenches 50 has a taper ratio of more than 2.5 in the dielectric structure 13.

Reliably manufacturing (a plurality) of contact trenches 50 with a taper ratio (w2/w1) of at most 2.5 in the dielectric structure has so far been challenging, in particular for aspect ratios (trench height to average trench width, e.g. (w2+w1)/2) of the contact trenches 50 of at least 1 or at least 2 and/or for small lateral size, i.e. for contact trenches 50 having a second value w2 which is at most about 1 µm, more typically at most about 950 nm.

The first value w1 may also be defined as the (horizontal) distance between the two points in the vertical cross-section at which the contact trench 50 adjoins the source region 3 and the dielectric structure 13 (i.e. points shared by the three regions 3, 12, 50). Further, the second value w2 may also be defined as the horizontal width of the contact trench 50 at an upper end of the contact trench 50 in the vertical cross-section.

The contact trench 50 may have a circular or a polygonal shape, e.g. a rectangular shape when seen from above (in planar view).

Likewise, the through contact portion 10" may have a circular or a polygonal shape, e.g. a rectangular shape when seen from above (in planar view).

As illustrated in FIG. 1 by the optional compensation region 5 arranged below, adjoining the body region 2 and being of the same conductivity type as the body region 2, the MOSFET 100 may be implemented as a compensation semiconductor device, typically as a power compensation semiconductor device having a rated breakdown voltage of at least about 100 V.

In these embodiments, a total number of free electrons provided by n-type dopants typically substantially matches a total number of free holes provided by p-type dopants in the compensation regions 5 and the drift portions 1a between the compensation regions 5. Typically, the total number of free electrons provided by the n-type dopants varies by less than 5%, more typically less than 1% from the total number of free holes provided by the p-type dopants. Accordingly, the drift portions 1a and the compensation regions 5 may form a pn-compensation structure.

Furthermore, the n-type drift region 1 may additionally include recombination centers for holes, such as platinum.

Even further, a drain region (not shown in FIG. 1) of the first conductivity type (n-type in the exemplary embodiment) is typically provided at the second side of the semiconductor body 40 and between the drift region 1 and the second side.

Typically, the doping concentration of the drain region is higher than the doping concentration of the drift region 1. Accordingly, the switching behaviour of the semiconductor device 100 may be improved.

Furthermore, a drain metallization (not shown in FIG. 1) in Ohmic contact with the drain region is typically arranged on and/or at the second side.

In embodiments referring to IGBTs, instead of a drain region a collector region 110 of the second conductivity type may be provided.

Figure 2:
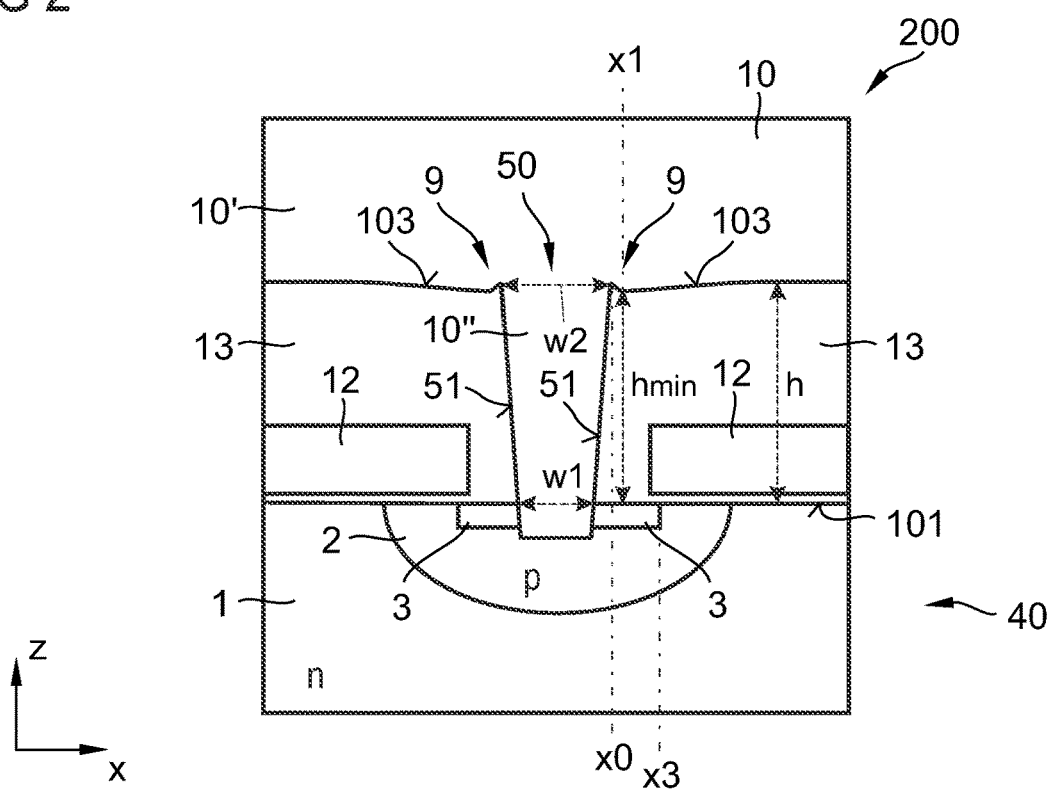
FIG. 2 illustrates a vertical cross-section through a semiconductor body of a semiconductor device according to an embodiment.

FIG. 2 illustrates a cross-section through a semiconductor device 200 which is similar to the semiconductor device 100 explained above with regard to FIG. 1. The semiconductor device 200 is typically also implemented as a MOSFET.

However, the contact trench 50 and the through contact portion 10" extend through the source region 3 partially into the body region 2. Accordingly, the latch-up behavior of the MOSFET 200 may be improved.

Further, in transition regions between the through contact portion 10" and a covering portion 10' (e.g. a source metallization or terminal) of the contact structure 10, and between a sidewall 51 of the contact trench 50 and the upper side 103, respectively, the dielectric structure 13 is, in the vertical cross-section, shaped like a cusp or nose 9. This may be due to the manufacturing process explained below with regard to FIG. 7 to FIG. 15. In the exemplary embodiment, the two cusp-like or nose-like structures 9 point upwards and are slightly angled towards each other. The cusp-like or nose-like structures 9 may have a size in a range from about 20 nm to about 50 nm, more typically in a range from about 30 nm to about 40 nm.

In the illustrated vertical cross-section, the interface formed between a sidewall 51 of the contact trench 50 and the adjoining portion of the upper side 103 may at least in the respective transition region substantially be described as a parametric plane curve having a cusp (singularity) in a mathematical sense.

As illustrated in FIG. 2, a vertical distance h(|x−x0|) between the first side 101 and the upper side 103 may decrease with increasing horizontal distance |x−x0| from the respective sidewall 51 of the contact trench 50 and/or from the through contact portion 10" in an adjacent portion of the transition region. Therein, x0 denotes the horizontal coordinate of the upper end of the respective (closest) side wall 51 in the used Cartesian coordinate system xz.

Typically, the vertical distance h(0) of the upper end of the sidewall(s) 51 from the first side 101 is larger than a minimum vertical distance $h_{min}$ between the first side 101 and the upper side 103, typically by at least about 10 nm.

The vertical distance h(0) of the upper end of the sidewall(s) 51 is typically at most about 100 nm larger than the minimum vertical distance between the first side 101 and the upper side 103.

Furthermore, the vertical distance h(|x−x0|) may reach the lowest value $h_{min}$, typically a minimum at a respective value |x1−x0| of the horizontal distance which is lower than a maximum horizontal distance |x3−x0| of the source region 3 in a projection onto the first side 101.

Even further, the vertical distance h(|x−x0|) typically only decreases for values of the horizontal distance |x−x0| which are smaller than about 70 nm, more typically smaller than 20 nm.

The illustrated structure may be at least substantially mirror symmetric with respect to central vertical axis running through the contact trench 50.

Figure 3:
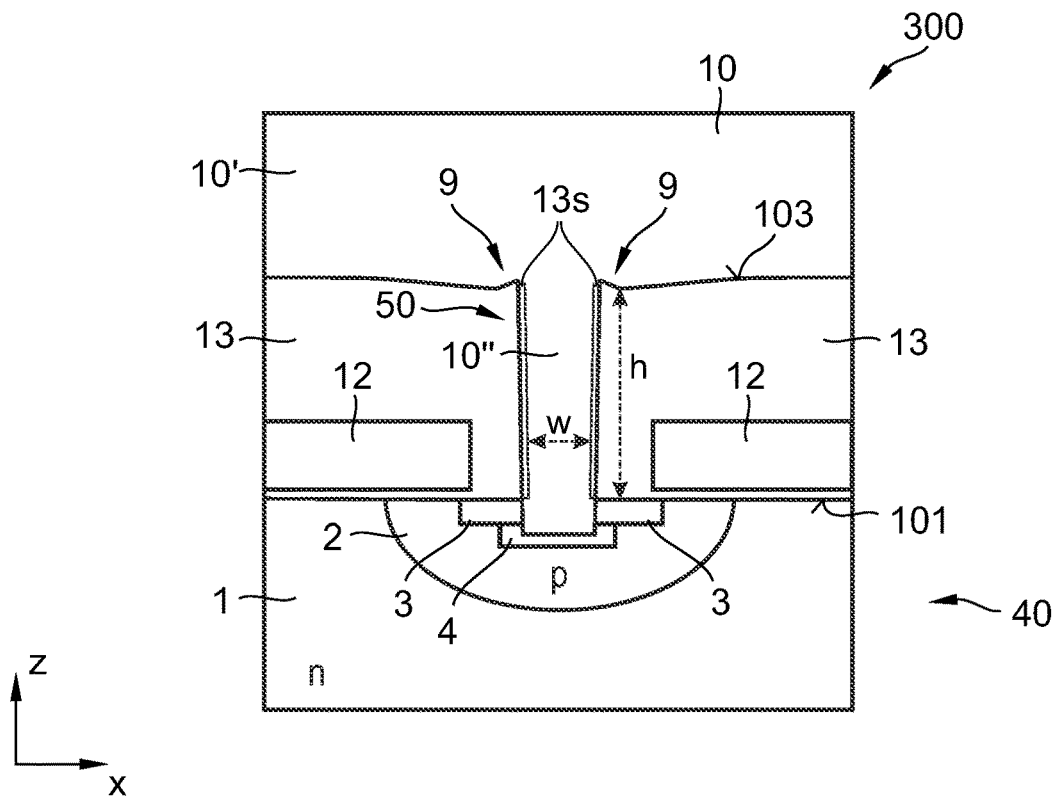
FIG. 3 illustrates a vertical cross-section through a semiconductor body of a semiconductor device according to an embodiment.

FIG. 3 illustrates a cross-section through a semiconductor device 300 which is similar to the semiconductor device 200 explained above with regard to FIG. 2. The semiconductor device 300 is typically also implemented as a MOSFET.

However, a higher (p-doped) body contact region 4 is arranged between the body region 2 and the through contact portion 10". Accordingly, a better Ohmic connection may be formed between the through contact portion 10" and the between the body region 2.

As illustrated in FIG. 3, a respective sidewall dielectric 13s may be arranged at the sidewalls 51 of the contact trench 50. This may also be due to manufacturing ensuring a low taper ratio of the contact trench 50.

The sidewall dielectrics 13s may have a layer thickness of at most about 10 nm or even of at most about 5 nm or 2 nm.

Typically, the sidewall dielectrics 13s are made of a TetraEthylOrthoSilicat (TEOS), more typically of an annealed TEOS.

Figure 4:
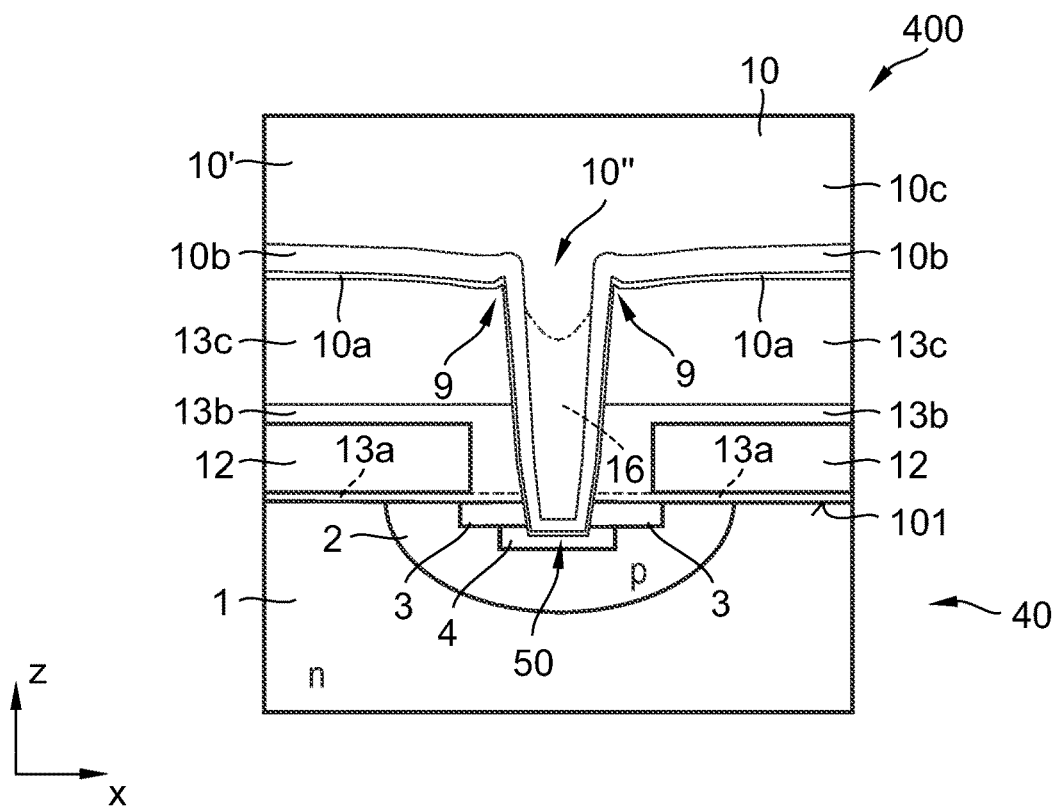
FIG. 4 illustrates a vertical cross-section through a semiconductor body of a semiconductor device according to an embodiment.

FIG. 4 illustrates a cross-section through a semiconductor device 400 which is similar to the semiconductor device 300 explained above with regard to FIG. 3. The semiconductor device 400 is typically also implemented as a MOSFET.

However, the source contact structure 10 of the semiconductor device 400 is made of three conductive layers 10a, 10b, and 10c.

According to an embodiment, the lower conductive layer 10a, which is arranged at the dielectric structure 13, is a titanium layer more typically a stacked titanium/titanium nitride (Ti/TiN) layer. Thereon, an intermediate conductive layer, typically an intermediate tungsten layer 10b is arranged. The upper conductive layer 10c arranged on the intermediate layer 10b may be made of a metal or an alloy comprising aluminium, copper and/or silicon.

For example, the upper conductive layer 10c may be made aluminum (Al), copper (Cu) or alloys of aluminum or copper, for example AlSi, AlCu, or AlSiCu.

The lower conductive layer 10a may form a barrier layer for Al.

Furthermore, the lower conductive layer 10a may be comparatively thin, e.g. may have a layer thickness in a range from about 10 nm to about 70 nm.

The layer thickness of the intermediate layer 10b is typically larger, e.g. has a layer thickness in a range from about 100 nm to about 300 nm.

In case a void 16 is formed in a lower portion of the contact trench 50, the intermediate layer 10b carries a major portion of the source drain current through the contact trench 50.

The layer thickness of the upper layer 10b (outside the contact trench 50) is typically even larger, typically in a range from about 3 μm to about 5 μm.

As illustrated in FIG. 4, the dielectric structure 13 may include in addition to the gate dielectric portions 13a typically made of thermal silicon oxide, silicon nitride or silicon oxynitride, a lower dielectric layer 13b arranged at the gate electrode(s) 12 and the gate dielectric portion(s) 13a. Typically, the lower dielectric layer 13b is made of a dielectric material such as undoped silicate glass (USG).

Furthermore, an upper dielectric layer 13c may be arranged on the lower dielectric layer 13b. Typically, the upper dielectric layer 13c is made of borophosphosilicate glass (BPSG). Accordingly, manufacturing costs may be reduced compared to semiconductor devices with an upper dielectric layer 13c made of USG.

For sake of clarity, the optional sidewall dielectric (13s) typically made of the same material as the lower dielectric layer 13b is not shown in FIG. 4.

This material combination allows efficient manufacturing of reliable semiconductor devices with the desired taper ratio of the contact trench(es) 50.

The thickness of the lower dielectric layer 13b above the gate electrode(s) 12 may be in a range from about 250 nm to about 350 nm.

The thickness of the upper dielectric layer 13c above the gate electrode(s) 12 may be in a range from about 1 μm to about 1.5 μm.

Figure 5:
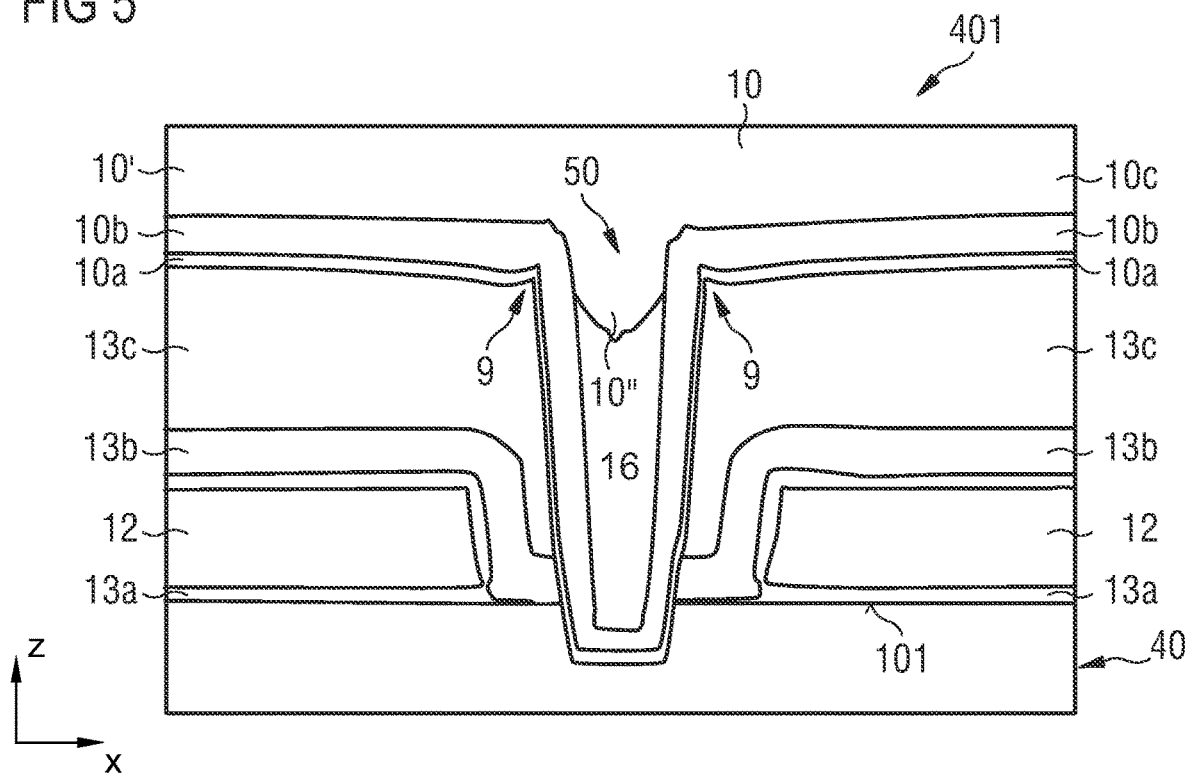
FIG. 5 illustrates a vertical cross-section through a semiconductor body of a semiconductor device according to an embodiment.

FIG. 5 illustrates a vertical cross-section through a semiconductor device 401 which is similar to the semiconductor device 400 explained above with regard to FIG. 4. The semiconductor device 401 is typically also implemented as a MOSFET and was manufactured as explained below with regard to FIG. 7 to FIG. 15. A closer inspection of FIG. 5, which corresponds to a formal line drawing of a cross-sectional view obtained using electron beam microscopy, the taper ratio (w2/w1) of the contact trench 50 in the dielectric structure 13 is about 1.8, and thus in the desired range ensuring that the covering portion 10' forms a homogenous sealing layer on the semiconductor body 40 and the dielectric structure 13. Accordingly, the semiconductor device 41 is safely protected against in diffusion of ions.

Figure 6:
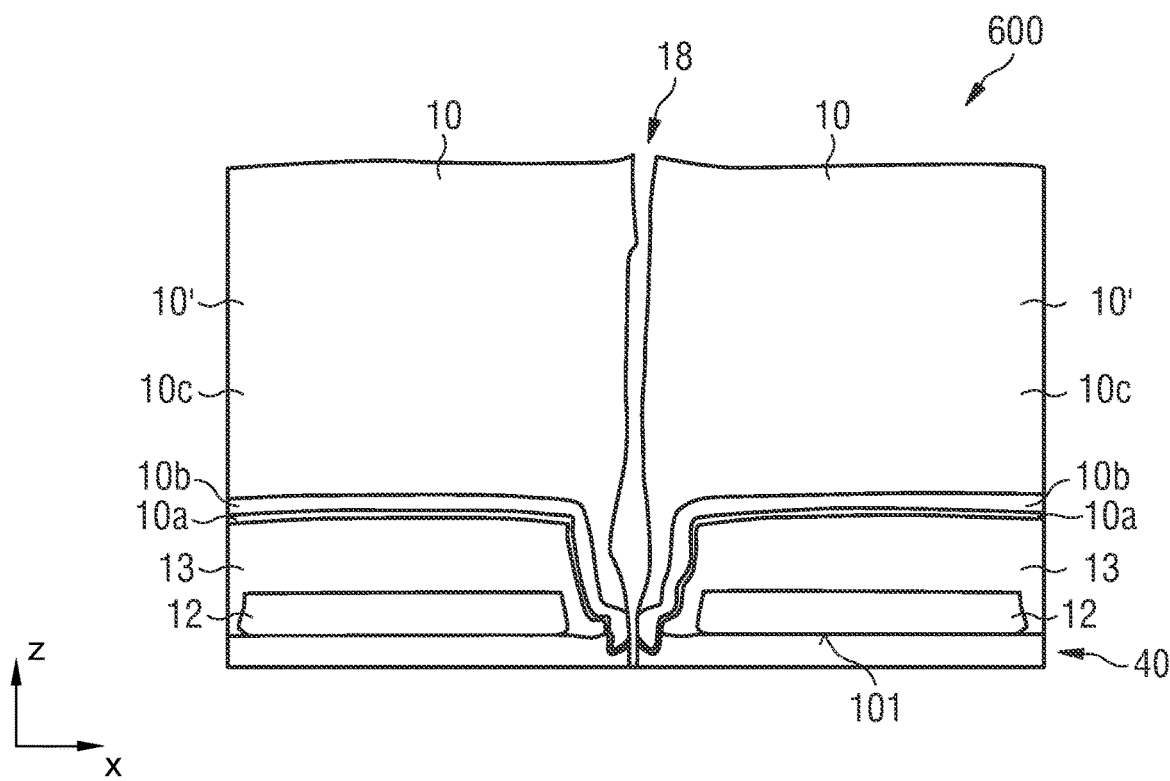
FIG. 6 illustrates a vertical cross-section through a semiconductor body of a semiconductor device; and FIG. 7 to FIG. 15 illustrates vertical cross-sections through a semiconductor body during method steps of methods according to embodiments.

Different thereto, FIG. 6 illustrates a corresponding cross-section of a semiconductor device 600 obtained similarly as the semiconductor device 401, however without a protecting the sidewalls of the contact trench 50 with a sidewall dielectric (13s) during manufacturing. This results in a larger taper ratio (w2/w1) of about 3:1 and finally in a crack 18 completely running through the first contact structure 10 and even slightly into the semiconductor body 40. Accordingly, the semiconductor device 600 has a high risk of changing its characteristics or even a failure during device operation due to in-diffusion of ions.

In the following, method steps of methods for manufacturing the semiconductor devices 100 to 401 as explained above with regard to FIGS. 1 to 4 are explained in respective vertical cross-sections.

In a first process, a wafer formed by a semiconductor body 40 having a first side 101, and a dielectric structure 13 arranged on the first side 101 and including, in the vertical cross-section, two gate electrodes 12 separated from the semiconductor body 40 may be provided. The semiconductor body 40 may for example be a silicon semiconductor body.

Figure 7:
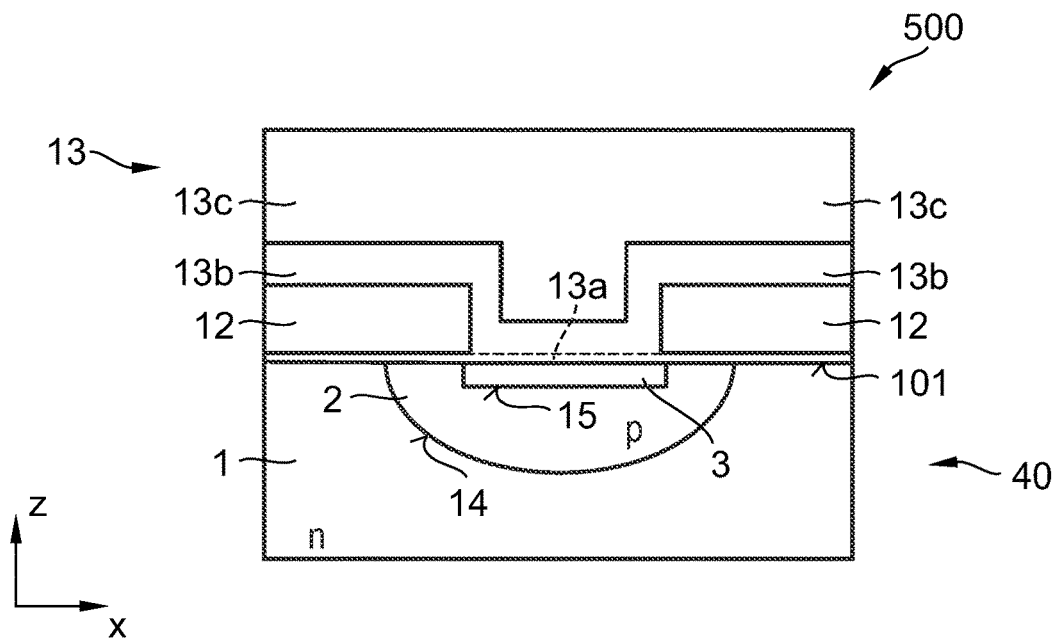

As illustrated in FIG. 7, the semiconductor body 40 typically includes a first semiconductor region 1 adjacent to the first side 101, a second semiconductor region 2 adjacent to the first side 101 and forming a first pn-junction 14 with the first semiconductor region 1, and a third semiconductor region 3 adjacent to the first side 101 and forming a second pn-junction 15 with the second semiconductor region 2.

In embodiments referring to manufacturing of MOSFETs, the first semiconductor region 1, the second semiconductor region 2, and the third semiconductor region 3 may form a drift region 1, a body region 2, and a source region 3, respectively.

Typically, FIG. 7 only corresponds to a small section of the wafer, more typically to a small section of an active area of one semiconductor device 500 of many semiconductor devices to be fabricated in parallel on wafer level.

In other words, the provided wafer typically includes a plurality of device areas, where each device area includes a plurality of transistor structures, more typically vertical power FET-structures, in particular a MOSFET-structure such as a plurality of VDMOS-structures formed in the semiconductor body 40.

Furthermore, at least the active area(s) of the provided semiconductor body 40 may include a compensation structure as explained above with regard to FIG. 1.

Charge-compensation semiconductor devices may be produced with a so-called 'multiple epitaxy' process. In this case, an n-doped epitaxial layer, which may be several µm thick, is first grown on a highly n-doped substrate and commonly referred to as 'buffer epi'. In addition to a doping level introduced in the epitaxial step doping ions are introduced into the buffer epi through a mask using implantation with the doping ions in the first charging locations (for example boron for phosphorous doping). Counter doping can be also employed with implantation (either through a mask, or on the entire surface). However, it is also possible to separate the individual epitaxial layers with the required doping. After that, the entire process is repeated as many times as required until an n (multi-epitaxial) layer is created which has a sufficient thickness and which is equipped with charge centers. The charge centers are mutually adjusted to each other and vertically stacked on top of each other. These centers are then merged with outward thermal diffusion in an undulating, vertical column to form adjacent p-type charge-compensation regions (compensation regions) and n-type charge-compensation regions (drift portions). The manufacturing of the actual devices can then be conducted at this point.

Another technique for fabricating charge-compensation semiconductor devices involves trench etching and compensation with trench filling. The volume which absorbs the voltage is deposited in a single epitaxial step (n-doped epi) on a highly n-doped substrate, so that the thickness corresponds to the total thickness of the multilayered epitaxial structure. After that, deep trenches are etched, which determine the form of the p-columns (compensation regions). The deep trenches are then filled with p-doped epi which is at least substantially free of crystal defects.

Both techniques may be used to manufacture the charge-compensation semiconductor devices as explained above with regard to FIGS. 1 to 5.

In the exemplary embodiment illustrated in FIG. 7, a first dielectric layer 13a, 13b is arranged on and at the first side 101, and a second dielectric layer 13c is arranged on and at the first dielectric layer 13a, 13b, wherein the gate electrodes 12 are embedded in the first dielectric layer 13a, 13b.

The first dielectric layer may be made of one material only. However, the first dielectric layer may also include a lower sublayer forming a gate dielectric layer 13a and an intermediate dielectric layer 13b covering at least the gate electrodes 12.

Providing the wafer may include providing the semiconductor body 40 and forming a gate dielectric layer 13a at the first side 101 of the semiconductor body 40.

In embodiments referring to manufacturing silicon semiconductor devices, the gate dielectric layer 13a may be formed by thermally oxidizing the semiconductor body 40 at the first side 101.

On the gate dielectric layer 13a, a gate electrode layer 12 may be formed, for example by depositing doped poly-Silicon.

Thereafter, the gate electrode layer 12 may be structured photographically to form the gate electrodes 12.

Thereafter, USG may be deposited, for example as a conformal layer 13b, on the gate electrodes 12 and the gate dielectric layer 12a. In the manufactured semiconductor device 500, the deposited layer 13b typically forms an intermediate dielectric layer 13b of the dielectric structure 13.

The intermediate dielectric layer 13b may have a layer thickness in a range from about 250 nm to about 350 nm.

Thereafter, another dielectric material such as BPSG may be deposited to form an upper dielectric layer 13c. The resulting structure is illustrated in FIG. 7.

The upper dielectric layer 13c may have a layer thickness in a range from about nm to about µm, more typically in a range from about 1 µm to about 1.5 µm.

Thereafter, a trench 50' may be formed through the second dielectric layer 13c and the first dielectric layer 13a, 13b, for example etched to the first side 101.

Figure 8:
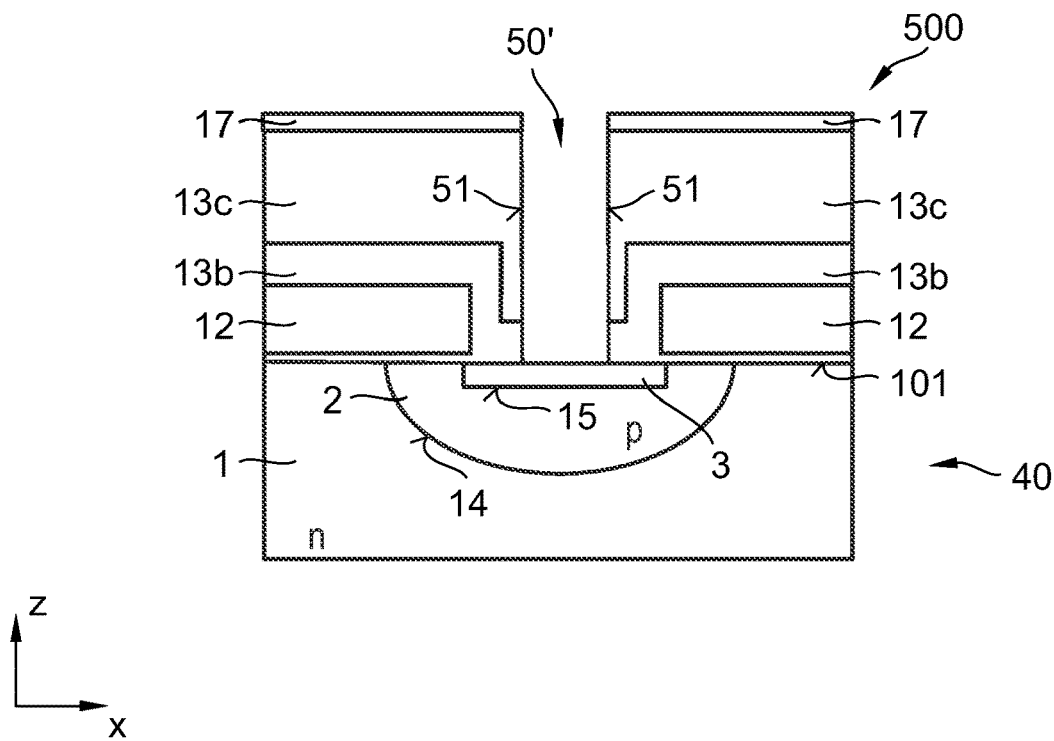

As illustrated in FIG. 8, a photographically structured mask 17 may be used for etching the trench 50' through the first and second dielectric layers 13a-13c.

The taper ratio of the trench 50 is typically close to one or example in a range from about 0.8 to about 1.2, more typically in a range from about 0.9 to 1.1.

The aspect ratio (height to width) of the trench 50 may be in a range from about 0.5 to about 5, more typically in a range from about 0.8 to about 2.

Thereafter, the mask 17 may be removed.

Thereafter, a dielectric spacer 13s may be formed at the side walls 51 of the trench 50.

Figure 9:
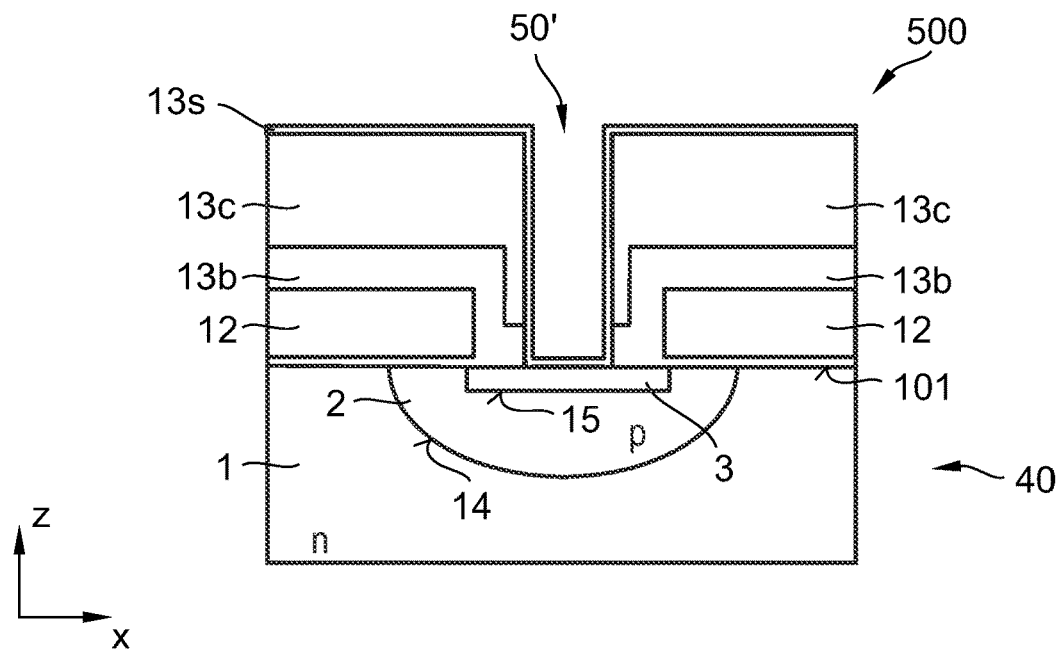

For this purpose, a material different to a material of the second dielectric layer 13c, more typically TEOS may be deposited as a conformal layer 13s, which is in the following also referred to as dielectric protecting layer 13s. The resulting structure 500 is illustrated in FIG. 9.

Typically, the dielectric protecting layer 13s has a layer thickness in a range from about 10 nm to about 50 nm, more typically in a range from about 20 nm to about 40 nm. For example, the layer thickness of the dielectric protecting layer 13s may be about 30 nm.

Figure 10:
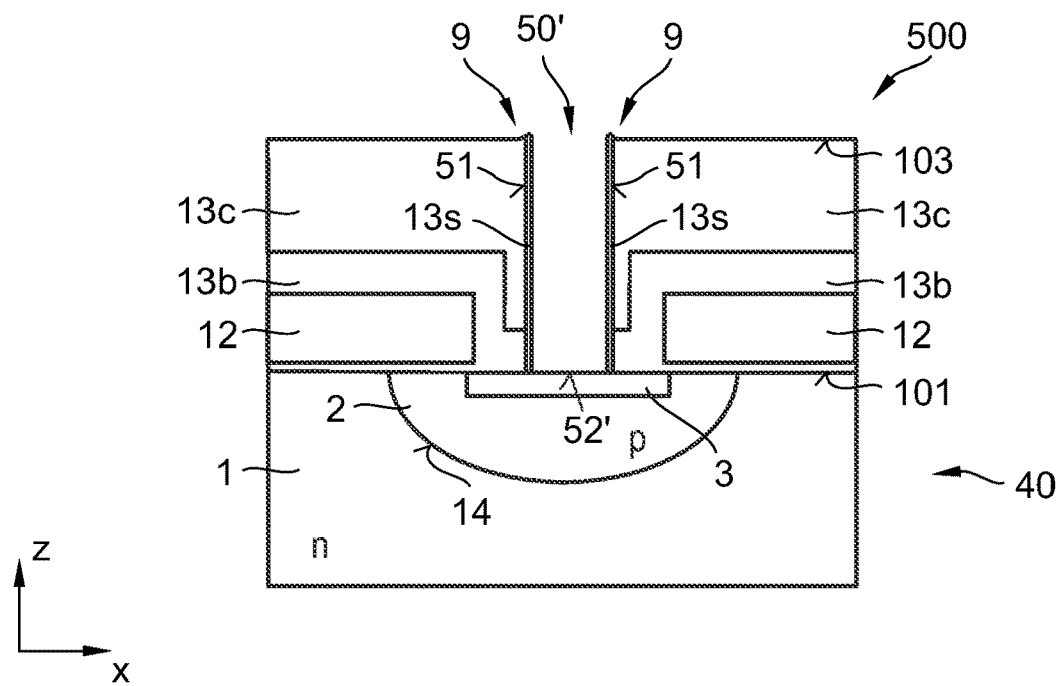

Thereafter, the dielectric protecting layer 13s may be anisotropically etched to remove the dielectric protecting layer 13s from the upper side 103 of the second dielectric layer 13c and a bottom wall 52' of the trench 50'. The resulting structure 500 including the formed dielectric spacer 13s is shown in FIG. 10.

Accordingly, a respective cusp-like or nose-like structure 9 is formed at the upper end of each of the sidewalls 51.

Thereafter, the trench 50' may be extended into the semiconductor body 40 to form a contact trench 50. This is typically achieved by etching while the sidewalls 51 of the trench 50' are protected by the protecting layer 13s. The resulting structure 500 including the formed (lowered) bottom wall 52 and adjacent lower sidewall portions 51' of the contact trench 50 in the semiconductor body 40 is shown in FIG. 11.

Accordingly, the taper ratio of the trench 50' and the contact trench 50 above the first side 101, respectively, is not or at least substantially not changed during extending the trench 50'.

Extending the trench 50' typically includes anisotropic etching of the semiconductor material.

Figure 11:
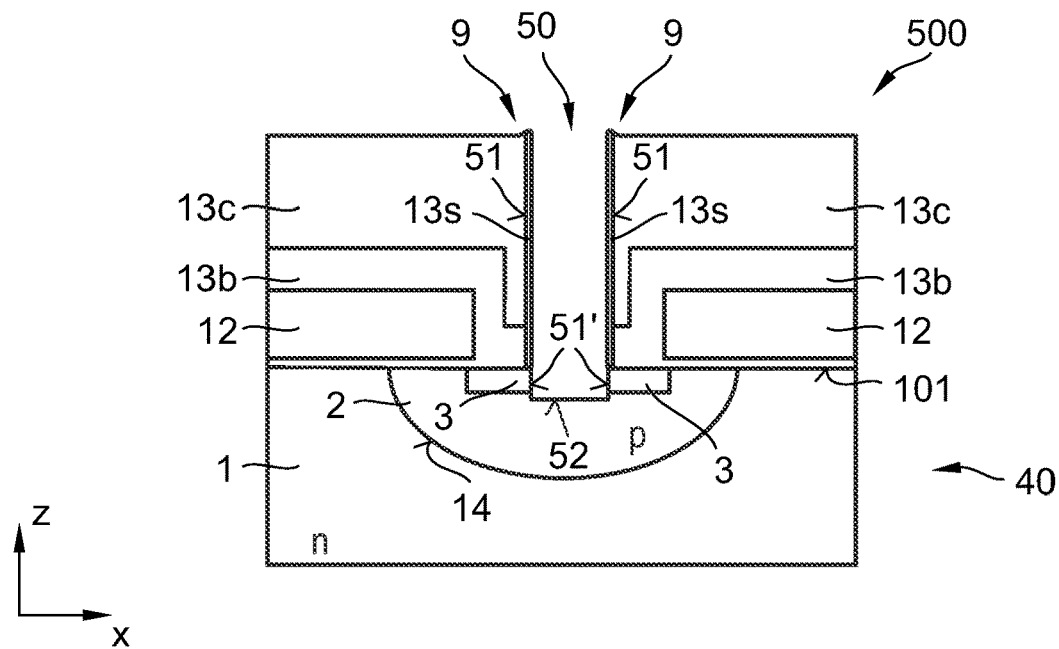

As illustrated in FIG. 11 (and FIG. 13), etching may be performed so that the formed contact trench 50 extends through the third semiconductor region 3 and partly into the second semiconductor region 2.

Figure 12:
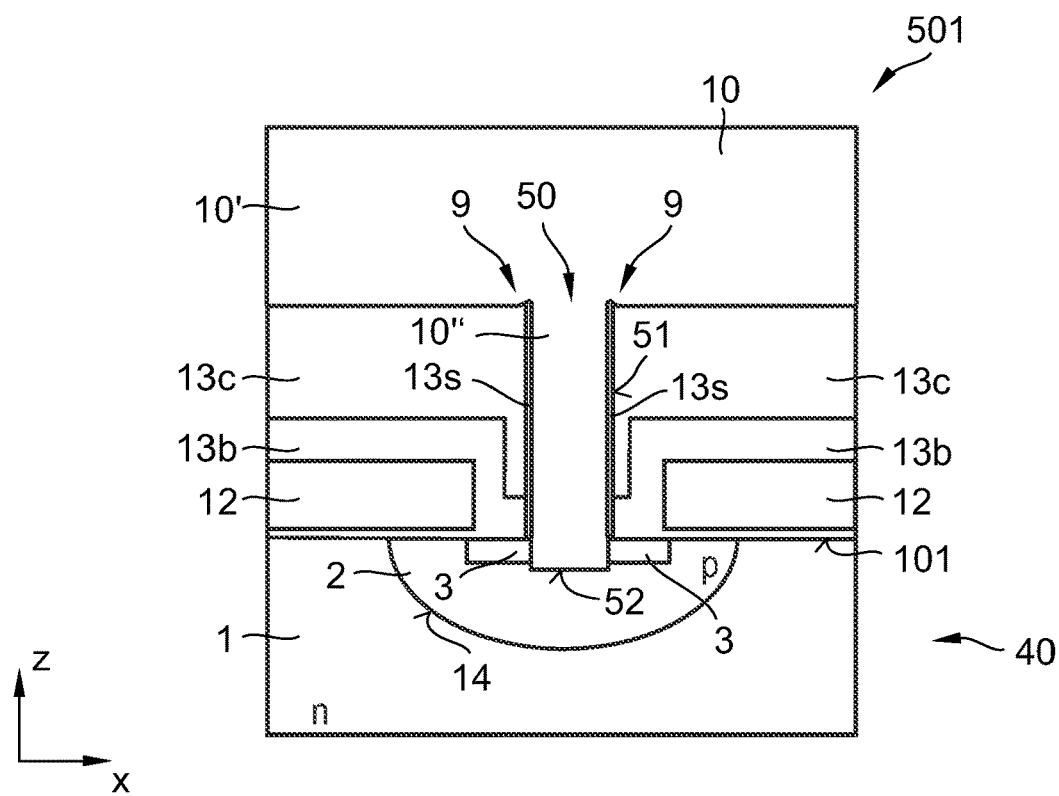

Thereafter, a contact structure 10 may be formed on the second dielectric layer 13*c* and in the contact trench 50. The resulting structure 501 is shown in FIG. 12. Processes for forming the contact structure 10 are explained below with regard to FIG. 15.

Figure 13:
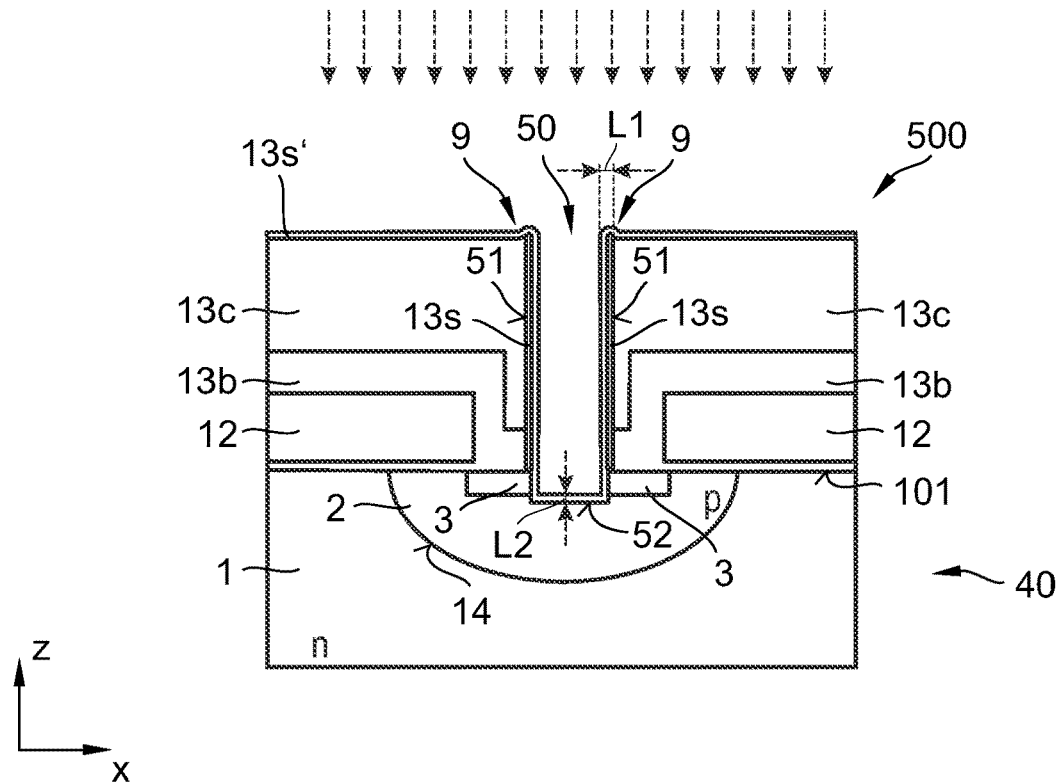

Prior to forming the contact structure 10, a dielectric stray layer 13*s*' may be deposited, typically as a conformal layer. The resulting structure 500 is shown in FIG. 13.

Typically, the dielectric stray layer 13*s*' and the dielectric spacer 13*s* are made of the same material, or at least of materials that are similar with respect to a later performed isotropic etching.

The dielectric stray layer 13*s*' and the dielectric spacer(s) 13*s* typically form a layered dielectric structure 13*s*, 13*s*' having a higher first layer thickness L1 at the sidewall 51 above the first side 101 compared to a second layer thickness L2 at the bottom wall 52 and the lower sidewall portions 51' of the contact trench 50 below the first side 101.

In the exemplary embodiment, the layered dielectric structure 13*s*, 13*s*' consists of a lower layer 13*s* arranged at the sidewall 51 and forming a dielectric spacer at the side wall(s) 51, respectively, and an upper layer 13*s*' covering the bottom wall 52, the lower layer 13*s*, and the dielectric structure 13.

Typically, the lower layer 13*s* and the upper layer 13*s*' are respective dielectric oxide layers. For example, the upper layer (dielectric stray layer) 13*s*' and the lower layer (dielectric spacer) 13*s* may be made of TEOS.

The layered dielectric structure 13*s*, 13*s*' may be used as a stray mask for implanting ions, for example Al-ions. This is illustrated in FIG. 13 by the dashed arrows.

According to an embodiment, the processes explained above with regard to FIGS. 7 to 11 and 13 may also be described as providing a wafer including a semiconductor body 40 including a first side 101, a first semiconductor region 1 adjacent to the first side, a second semiconductor region 2 adjacent to the first side and forming a first pn-junction 14 with the first semiconductor region 1, and a third semiconductor region 3 adjacent to the first side and forming a second pn-junction 15 with the second semiconductor region 2, a dielectric structure 13*a*, 13*b*, 13*c* arranged at the first side 101 and extending to an upper side 103 dielectric structure, a gate electrode 12 embedded in the dielectric structure 13*a*, 13*b*, 13*c*, a contact trench 50 extending next to the gate electrode 12 through dielectric structure 13*a*, 13*b*, 13*c* into the third semiconductor region 3, and a sidewall 51 which is arranged at the dielectric structure 13*a*, 13*b*, 13*c*, and a bottom wall 52, and a layered structure 13*s*, 13*s*' of a dielectric material covering the bottom wall 52 and the sidewall 51 and comprising a first layer thickness at the sidewall 51 and a second layer thickness at the bottom wall 52 lower than the first layer thickness.

After implanting the ions through the dielectric stray layer 13*s*' and the bottom wall 52 of the contact trench 50 into the semiconductor body 40, a thermal annealing process may be used to activate the implanted ions in the semiconductor material.

Thereafter, isotropic etching, typically a wet-chemical etching may be used to remove the dielectric stray layer 13*s*'. In the exemplary embodiment, this results in exposing the semiconductor body 40 in a bottom portion of the contact trench 50 below the first side 101. Typically, the semiconductor body 40 is exposed at the bottom wall 52 and the adjacent lower sidewall portions 51' of the contact trench 50 below the first side 101.

The isotropic etching is typically performed so that an etching rate of the second dielectric layer 13*c* is higher by a factor of at least two, more typically of at least five than an etching rate of the dielectric spacer(s) 13*s* and the dielectric stray layer 13*s*'.

Figure 14:
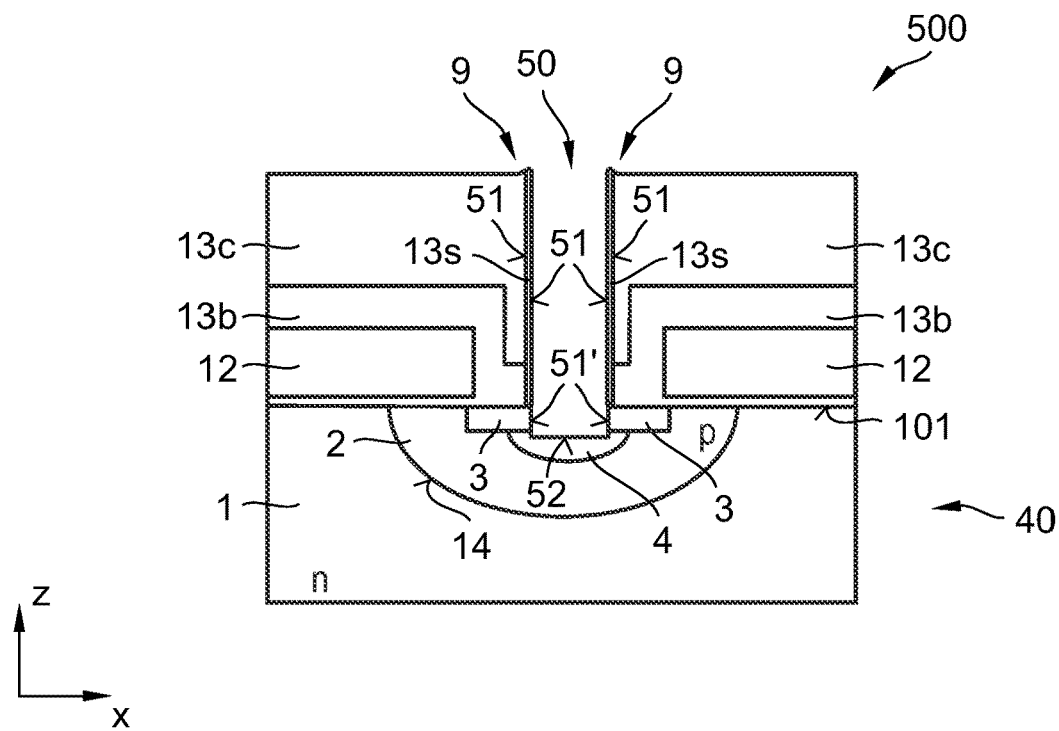

As illustrated in FIG. 14, as thin remainder of the dielectric layer 13*s*, e.g. an at most a few nm-thick remainder may still cover the sidewalls 51 after isotropic etching the dielectric stray layer 13*s*'.

In other embodiments, the dielectric layer (dielectric spacer) 13*s* is at least substantially removed.

If the dielectric stray layer 13*s*' is removed without protecting the sidewalls 51 by the dielectric spacer(s) 13*s*, the taper ratio is very likely to be unfavorably increased. Note that BPSG may have an about 10 times higher etching rate than TEOS and USG. This may result in a structure as illustrated in FIG. 6 which is susceptible to external ions.

Figure 15:
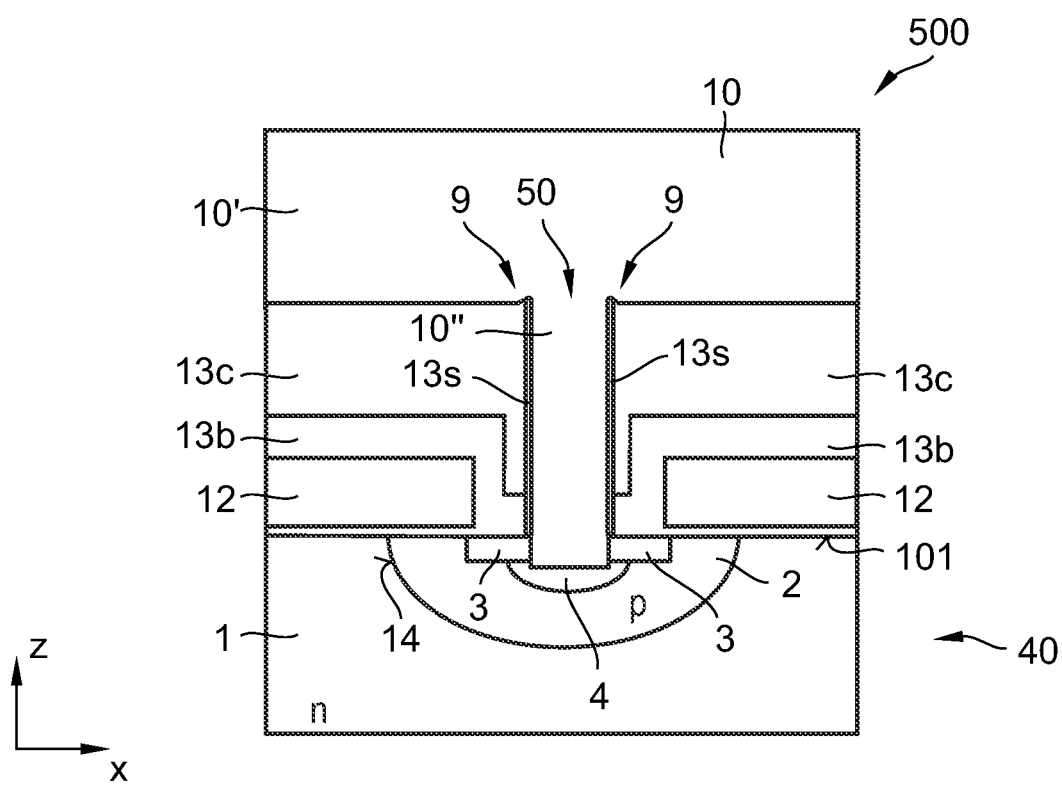

Thereafter, a contact structure 10 may be formed on the second dielectric layer 13*c* and in the trench 50. The resulting structure 500 is shown in FIG. 15.

Typically, the contact structure 10 is formed as a layered structure as shown above in FIG. 4.

After optional cleaning exposed surfaces of the contact trench 50 and the dielectric structure 13*a*, 13*b*, 13*c*, one or more conductive layers may be deposited.

For example, a wet chemical etching such as HF-etching may be used to clean the exposed surfaces.

Thereafter, a thin titanium layer may be deposited on and at the (cleaned) exposed surfaces, typically as a conformal layer. Due to a typically later used annealing, a titanium silicide layer may be formed between the titanium layer and the semiconductor body 40.

Thereafter, a titanium nitride layer may be deposited on and at the titanium nitride layer, typically as a conformal layer.

Thereafter, a tungsten layer may be deposited on and at the titanium nitride layer, typically as a conformal layer.

Thereafter, an alloy may be deposited on and at the tungsten layer, typically as a conformal layer.

The deposited alloy may include aluminum and copper. Additionally, the deposited alloy may include silicon.

Thereafter, an upper surface of the deposited alloy may be smoothed, for example by chemical mechanical polishing.

Further, the covering portion 10' of the formed contact structure 10 on the first side may be photo-lithographically structured to form a source terminal and a gate terminal.

Thereafter, a drain metallization (terminal) may be formed opposite the first contact structure 10.

Thereafter, the semiconductor body (wafer) may be separated, e.g. by sawing along sawing or scribe lines, into individual semiconductor devices, so that the semiconductor devices have a corresponding lateral edge which delimits the semiconductor devices in a horizontal direction substantially parallel to the first side 101.

According to an embodiment of a method for manufacturing a MOSFET, the method includes providing a wafer including a semiconductor body 40 including a first side 101, a first semiconductor region 1 adjacent to the first side, a second semiconductor region 2 adjacent to the first side and forming a first pn-junction 14 with the first semiconductor region 1, and a third semiconductor region 3 adjacent to the first side and forming a second pn-junction 15 with the second semiconductor region 2, a dielectric structure 13a, 13b, 13c extending between the first side 101 and upper side 103, a gate electrode 12 embedded in the dielectric structure 13a, 13b, 13c, a contact trench 50 extending through the dielectric structure 13a, 13b, 13c into the third semiconductor region 3, and including a sidewall 51 which is arranged at the dielectric structure 13a, 13b, 13c and a bottom wall 52, and a layered dielectric oxide structure 13s, 13s' including a lower dielectric oxide layer 13s arranged at the sidewall 51, and an upper dielectric oxide layer 13s' covering the bottom wall 52 and the lower dielectric oxide layer 13s. The semiconductor body is further processed from the first side 101. Further processing may include implanting ions through the layered dielectric oxide 13s, 13s' and the bottom wall 52 of the contact trench 50 into the semiconductor body 40. Isotropic oxide-etching is used to expose the bottom wall 52 so that the lower dielectric oxide layer 13s is only partly removed or that the oxide-etching is stopped if the lower dielectric oxide layer 13s at the sidewall 51 is at least substantially removed.

According to an embodiment, a field-effect semiconductor device includes a semiconductor body including a first side, a drift region adjacent to the first side, a body region adjacent to the first side and forming a first pn-junction with the drift region, and a source region adjacent to the first side and forming a second pn-junction with the body region. In a vertical cross-section perpendicular to the first side, the MOSFET further includes a dielectric structure arranged on the first side, and having an upper side, a first gate electrode embedded in the dielectric structure, a second gate electrode embedded in the dielectric structure, and a contact trench arranged between the first gate electrode and the second gate electrode, extending through the dielectric structure and at least to the source region. In the vertical cross-section, a taper ratio of the contact trench is at most about 2.5. A first contact structure is arranged on the dielectric structure. The first contact structure includes a through contact portion which is arranged in the contact trench and in Ohmic contact with the source region.

According to an embodiment, a field-effect semiconductor device includes a semiconductor body including a first side, a first semiconductor region adjacent to the first side, a second semiconductor region adjacent to the first side and forming a first pn-junction with the first semiconductor region, and a third semiconductor region adjacent to the first side and forming a second pn-junction with the second semiconductor region. in a vertical cross-section perpendicular to the first side the field-effect semiconductor device further includes a dielectric structure arranged on the first side, a first gate electrode embedded in the dielectric structure, a second gate electrode embedded in the dielectric structure, a contact trench arranged between the first gate electrode and the second gate electrode, extending through the dielectric structure and to the third semiconductor region, and a first contact structure arranged on and/or at the dielectric structure. The first contact structure includes a through contact portion arranged in the contact trench and in Ohmic contact with the third semiconductor region, and a covering portion adjoining the through contact portion, and forming outside the contact trench an interface with the dielectric structure. In the vertical cross-section, a vertical distance between the first side and the interface decreases with increasing horizontal distance from a sidewall of the contact trench and/or from the through contact portion, at least close to the sidewall of the contact trench and the through contact portion, respectively.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A MOSFET, comprising:
 a semiconductor body comprising a first side, a drift region adjacent to the first side, a body region adjacent to the first side and forming a first pn-junction with the drift region, and a source region adjacent to the first side and forming a second pn-junction with the body region;
 in a vertical cross-section perpendicular to the first side, the MOSFET further comprises:
  a dielectric structure arranged on the first side and having an upper side;
  a first gate electrode;
  a second gate electrode;
  a contact trench arranged between the first gate electrode and the second gate electrode, extending through the dielectric structure and at least to the source region, wherein in a horizontal direction a width of the contact trench has, in a first plane defined by the first side, a first value, and, in a second plane defined by the upper side, a second value which is at most about 2.5 times the first value; and
  a first contact structure arranged on the dielectric structure and comprising a through contact portion arranged in the contact trench, and in Ohmic contact with the source region.

2. The MOSFET of claim 1, wherein, the second value is at most about 1 μm, wherein a vertical distance between the first side and the upper side decreases with increasing horizontal distance from a sidewall of the contact trench and/or from the through contact portion, wherein a vertical distance of an upper end of the sidewall from the first side is larger than a minimum vertical distance between the first side and the upper side, wherein the vertical distance of the upper end of the sidewall from the first side is at most about 100 nm larger than the minimum vertical distance between the first side and the upper side, and/or wherein the vertical distance has a lowest value at a value of the horizontal distance which is lower than a maximum distance of the source region in a projection onto the first side, wherein the vertical distance only decreases for values of the horizontal distance which are smaller than about 70 nm.

3. The MOSFET of claim 1, wherein the MOSFET comprises in the vertical cross-section a plurality of MOSFET-cells each comprising a respective contact trench arranged between two adjacent gate electrodes, and extending through the dielectric structure and at least to a respective source region, wherein the MOSFET is implemented as a power semiconductor device, and/or wherein the MOSFET is implemented as a compensation semiconductor device.

4. The MOSFET of claim 1, wherein, in the vertical cross-section, a transition region between the sidewall and the upper side and/or a surface of the contact structure in a transition region between the through contact portion and a covering portion of the first contact structure has a parametric plane curve comprising a cusp.

5. The MOSFET of claim 1, wherein the drift region comprises dopants of the n-type and/or recombination centers for holes.

6. The MOSFET of claim 1, wherein the first and second gate electrodes are each embedded in the dielectric structure comprises.

7. The MOSFET of claim 6, wherein, in the vertical cross-section, the dielectric structure comprises:
  a first gate dielectric portion arranged between the first gate electrode and the first side;
  a second gate dielectric portion arranged between the second gate electrode and the first side;
  a lower dielectric layer arranged at the first gate electrode and the second gate electrode;
  an upper dielectric layer arranged on the lower dielectric layer; and/or
  a sidewall dielectric arranged at the sidewall and having a layer thickness of at most about 10 nm.

8. The MOSFET of claim 1, wherein, in the vertical cross-section, the first contact structure comprises:
  a lower conductive layer forming an interface with the dielectric structure at the upper side;
  an intermediate conductive layer arranged on the lower conductive layer; and/or
  an upper conductive layer arranged on the intermediate conductive layer.

9. The MOSFET of claim 8, wherein the lower conductive layer comprises titanium, wherein the intermediate conductive layer comprises tungsten, and wherein the upper conductive layer comprises an alloy comprising at least one of aluminum, copper and silicon.

* * * * *